United States Patent
Gao et al.

(10) Patent No.: US 11,876,142 B2
(45) Date of Patent: Jan. 16, 2024

(54) PN JUNCTION AND PREPARATION METHOD AND USE THEREOF

(71) Applicant: Sunflare Co, La Verne, CA (US)

(72) Inventors: Liang Gao, Rowland Heights, CA (US); Zhun Zhang, Chaozhou (CN); Yu-Ting Lin, Taichung (TW)

(73) Assignee: Sunflare Co, La Verne, CA (US)

( * ) Notice: Subject to any disclaimer, the term of this patent is extended or adjusted under 35 U.S.C. 154(b) by 271 days.

(21) Appl. No.: 16/837,189

(22) Filed: Apr. 1, 2020

(65) Prior Publication Data

US 2020/0321484 A1    Oct. 8, 2020

(30) Foreign Application Priority Data

Apr. 3, 2019   (CN) .......................... 201910266450.8

(51) Int. Cl.
*H01L 31/032*    (2006.01)
*C23C 14/18*    (2006.01)
(Continued)

(52) U.S. Cl.
CPC .......... *H01L 31/0322* (2013.01); *C23C 14/18* (2013.01); *C23C 14/35* (2013.01);
(Continued)

(58) Field of Classification Search
CPC ......... H01L 31/0322; H01L 31/022466; H01L 31/02322; H01L 31/103; H01L 31/173;
(Continued)

(56) References Cited

U.S. PATENT DOCUMENTS

2009/0084963 A1* 4/2009 Kost .................. H01L 31/055
                                              250/206
2010/0102368 A1* 4/2010 Matsushima .......... H01L 31/18
                                              257/E31.127
(Continued)

FOREIGN PATENT DOCUMENTS

CN    102496645 A  *  6/2012  ......... H01L 31/0322
CN    102496645 B     8/2013
(Continued)

OTHER PUBLICATIONS

Huang, Chia-Hua, et al., "Deposition Technologies of High-Efficiency CIGS Solar Cells: Development of Two-Step and Co-Evaporation Processes." Crystals, vol. 8, 296, Jul. 18, 2018, pp. 1-17.

(Continued)

*Primary Examiner* — Jonathan Han
(74) *Attorney, Agent, or Firm* — Lerner David LLP (57) ABSTRACT

The patent application relates to a PN junction as well as the preparation method and use thereof. Said PN junction comprises a p-type CIGS semiconductor thin film layer and an n-type CIGS semiconductor thin film layer, wherein the n-type CIGS semiconductor thin film layer comprises or consists essentially of elements Cu, In, Ga and Se, where the Cu to In molar ratio is within the range of 1.1 to 1.5, and has a chemical formula of $Cu(In_xGa_{1-x})Se_2$, where x is within the range of 0.6 to 0.9. The patent application further relates to a semiconductor thin film element comprising said PN junction, in particular a photodiode element, and a photoelectric sensing module comprising said semiconductor thin film element as well as the various uses thereof.

19 Claims, 3 Drawing Sheets

(51) Int. Cl.
| | |
|---|---|
| *C23C 14/35* | (2006.01) |
| *C23C 14/58* | (2006.01) |
| *H01L 31/0224* | (2006.01) |
| *H01L 31/0232* | (2014.01) |
| *H01L 31/103* | (2006.01) |
| *H01L 31/173* | (2006.01) |
| *H01L 31/18* | (2006.01) |

(52) U.S. Cl.
CPC .... *C23C 14/5806* (2013.01); *H01L 31/02322* (2013.01); *H01L 31/022466* (2013.01); *H01L 31/103* (2013.01); *H01L 31/173* (2013.01); *H01L 31/1864* (2013.01)

(58) Field of Classification Search
CPC . H01L 31/1864; H01L 31/068; H01L 31/153; H01L 21/02568; H01L 21/02631; H01L 31/0323; H01L 31/18; C23C 14/18; C23C 14/35; C23C 14/5806; Y02E 10/541; Y02E 10/547; Y02E 10/548
See application file for complete search history.

(56) References Cited

U.S. PATENT DOCUMENTS

| | | | |
|---|---|---|---|
| 2015/0249106 A1 | 9/2015 | Jiroku | |
| 2016/0336475 A1* | 11/2016 | Mackie | H01L 21/02631 |
| 2017/0208254 A1* | 7/2017 | Ikeda | H01L 29/7869 |
| 2019/0305156 A1 | 10/2019 | Ren et al. | |

FOREIGN PATENT DOCUMENTS

| | | | | |
|---|---|---|---|---|
| CN | 104882457 A | | 9/2015 | |
| CN | 205595351 U | * | 9/2016 | |
| CN | 205595351 U | | 9/2016 | |
| CN | 108470783 A | | 8/2018 | |
| EP | 2913852 A1 | * | 9/2015 | ....... H01L 27/14609 |
| EP | 2913852 A1 | | 9/2015 | |
| JP | 2015056484 A | * | 3/2015 | |
| JP | 2016131229 A | | 7/2016 | |

OTHER PUBLICATIONS

Shin, Young Min, et al., "Surface modification of CIGS film by annealing and its effect on the band structure and photovoltaic properties of CIGS solarl cells." Current Applied Physics, vol. 15, available online Sep. 30, 2014 (2015) pp. 18-24.

Fathi, Mohamed, et al. "Study of thin film solar cells in high temperature condition." Energy Procedia, vol. 74, 2015, pp. 1410-1417.

Lindahl, Johan, et al. "Inline Cu(In, Ga)Se2 Co-evaporation for High Efficiency Solar Cells and Modules." IEEE Journal of Photovoltaics, vol. 3, No. 3, Jul. 2013, pp. 1100-1105.

European Search Report for EP20167490 completed Aug. 18, 2020; 2 pages.

* cited by examiner

PN JUNCTION AND PREPARATION METHOD AND USE THEREOF

FIELD OF THE INVENTION

The patent application relates to a PN junction as well as the preparation method and use thereof. The patent application further relates to a semiconductor thin film element, in particular a photodiode element, comprising said PN junction and a photoelectric sensing module comprising said semiconductor thin film element as well as the various uses thereof.

BACKGROUND OF THE INVENTION

Copper Indium Gallium Selenium (CIGS) semiconductor thin film has excellent light sensing characteristics not only to visible light, but also to light within the IR to NIR range (780 to 1100 nm) in comparison with conventional semiconductor thin films. Therefore, CIGS semiconductor thin film can be used for the production of a broadband photodiode element.

Figure 1:
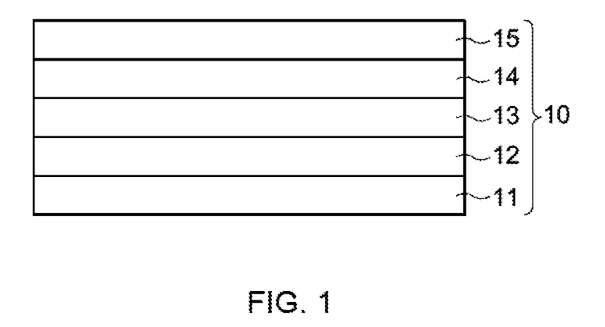
FIG. 1 is a photodiode element according to the prior art, comprising a p-type CIGS semiconductor thin film layer and an n-type compound semiconductor thin film layer.

A conventional CIGS photodiode element comprises (1) a metal electrode thin film layer as anode, (2) a p-type CIGS semiconductor thin film layer as a light absorbing layer, (3) an n-type compound semiconductor thin film layer as a buffer layer, (4) a transparent metal oxide conducting thin film layer as a conducting layer and (5) a transparent metal oxide thin film layer as cathode (FIG. 1).

The metal electrode thin film layer as anode is usually produced by sputter coating using molybdenum.

The p-type CIGS semiconductor thin film layer as a light absorbing layer having high photoelectric conversion characteristics is usually obtained by depositing the CIGS thin film on a substrate coated with the metal electrode thin film layer as anode by vacuum magnetron sputter coating, vacuum co-evaporation coating, printing coating or electroplating coating using binary, trinary or quaternary targets containing elements selected from Cu, In, Ga and Se and processing the same with a selenization treatment. The selenization treatment is the most important step in the conventional process when preparing CIGS. The aim of the selenization treatment is to increase the Se ratio in CIGS, so that the surface bandgap of the element is increased, and thereby addressing the issue that the open-circuit voltage is too low. The selenization treatment is crucial to the grain size and composition of CIGS, and thereby affecting the photoelectric conversion efficiency of CIGS.

The selenization treatment mainly converts a metal precursor to a selenide semiconductor material under a chemical atmosphere of selenium. There are two kinds of common selenization treatments, one is rapid thermal process (RTP) selenization and the other is $H_2Se$ thermal treatment. The RTP uses a solid selenium source for heating, the advantage is the fast reaction, and the drawback is that it is difficult to control the homogeneity of the atmosphere so that the grain size and composition are not adjustable, and thereby the efficiency of the resulted element is low. The $H_2Se$ thermal treatment uses $H_2Se$ for selenization, the advantage is that the atmosphere is controllable so that an element with high efficiency can be obtained, and the drawback is that the batch tube furnace reaction is slow, which causes a long reaction time (8 to 10 hours).

The n-type compound semiconductor thin film layer as a buffer layer requires a bandgap matching that of the light absorbing layer, so that a depletion region with sufficient thickness is formed. The buffer layer can prevent the light absorbing layer from being destroyed by the subsequent high energy sputter coating process and can protect the inner crystal structure of the light absorbing layer. The n-type compound semiconductor thin film layer has a direct bandgap and the surface thereof can be doped with Ga or S ions to increase the bandgap, where CdS is frequently used as the material for the n-type compound semiconductor thin film layer. However, considering environmental protection, an n-type compound semiconductor thin film layer which is Cd-free is required.

CN 108470783 A discloses a photosensitive element comprising a p-type CIGS semiconductor thin film layer, an i-type CIGS semiconductor thin film layer and an n-type CIGS semiconductor thin film layer (PIN). The energy bandwidth of an i-type CIGS semiconductor thin film (Eg) is around 1.37 eV and the chemical structure thereof is $\beta\text{-}Cu_{0.49}(In_{0.56}Ga_{0.44})_3Se_5$. Accordingly, the preparation of an i-type CIGS semiconductor thin film requires excess amounts of selenium and a high temperature selenization process, i.e, an i-type CIGS semiconductor thin film cannot be prepared simply by sputter coating or evaporation coating. In a PIN photosensitive element, the p-type CIGS semiconductor thin film layer is prepared by the following steps: coating the i-type CIGS semiconductor thin film layer, contacting the same with Cu or Cu alloy electrode, annealing the same at high temperature so that the Cu element of the electrode diffuses to the i-type CIGS semiconductor thin film layer, and thereby the p-type CIGS semiconductor thin film layer is formed. The depth that the Cu element diffuses to the i-type CIGS semiconductor thin film layer is insufficient in such preparation process, so that defects at the interface between the metal electrode and the p-type CIGS semiconductor thin film layer are generated, and thereby proper ohmic contact cannot be formed. Moreover, CN 108470783 A mentions that the i-type CIGS semiconductor thin film layer is for absorbing light, generating electron-hole pairs by the absorbed light and converting the formed current to an electrical signal through the in-built electric field of the PIN structure. However, the i-type CIGS semiconductor thin film layer has many defects in the crystal structure. CN 108470783 A discloses that the thickness of the i-type CIGS semiconductor thin film layer ranges from 300 nm to 3000 nm and the thicknesses of the p-type CIGS semiconductor thin film layer and the n-type CIGS semiconductor thin film layer range from 50 nm to 300 nm, and thus there are many defects within the i-type CIGS semiconductor thin film layer. The defects lower the efficiency of forming electron-hole pairs, and the interface between the metal electrode and the p-type CIGS semiconductor thin film layer cannot form proper ohmic contact, and thus the in-built electric field cannot effectively separate the electron-hole pairs and form carrier current. Hence, the CIGS element with PIN structure cannot function effectively. Besides, given that the i-type CIGS semiconductor is thermodynamically unstable, and thereby phase separation occurs during annealing treatment, so it would be difficult to reduce the defects by annealing.

The selenization treatment of the p-type CIGS semiconductor thin film layer and the coating of the n-type compound semiconductor thin film layer using CdS both involve high temperature chemical reactions, so that the inner structure of the films are influenced, and thereby damaging the photoelectric conversion efficiency of the resulting photodiode element. Therefore, a PN junction requiring no selenization treatment and containing no Cd is required, and the PN junction should be suitable to be used in semiconductor thin film elements.

SUMMARY OF THE INVENTION

An object of the present invention is to provide a PN junction requiring no selenization treatment and using no Cd buffer layer.

Another object of the present invention is to provide a semiconductor thin film element, in particular a photodiode element, comprising said PN junction. According to one embodiment of the present invention, said photodiode element further comprises a layer containing a molybdenum compound. According to another embodiment of the present invention, said photodiode element further comprises a light converting thin film layer emitting light having a wavelength within the range of 350 nm to 1300 nm. According to another embodiment of the present invention, said photodiode element further comprises both a layer containing a molybdenum compound and a light converting thin film layer emitting light within the range of 350 nm to 1300 nm.

Another object of the present invention is to provide a photoelectric sensing module comprising said semiconductor thin film element, in particular a photodiode element, comprising said PN junction.

Another object of the present invention is to provide a use of said photoelectric sensing module, for biometrics, an IR imaging night vision system, an NIR photoelectric switch or an X-ray camera.

The additional characteristics and advantages of the present inventions will be partially disclosed in the following sections or illustrated by the working examples of the subject application.

BRIEF DESCRIPTION OF THE DRAWINGS

The following text will briefly describe drawings necessary for describing the working examples of the subject application or for describing the prior art so that the working examples of the subject application are more comprehensible. Obviously, the drawings described in the following text are only a part of the working examples of the subject application, and a person of ordinary skill in the art can deduce other working examples in view of the structures illustrated in the drawings of the subject application without difficulty.

DETAILED DESCRIPTION OF THE INVENTION

The working examples of the subject application will be described in detail in the following text. Common reference numerals are used throughout the drawings and the detailed description section to indicate the same or similar components. The working examples concerning the drawings described herein are for explanation and/or illustration and for providing a better understanding of the subject application. The working examples of the subject application shall not be interpreted as limitations to the subject application.

In order to facilitate understanding of the disclosure herein, terms are hereby defined below.

The term "about" refers to an acceptable deviation of a given value measured by a person of ordinary skill in the art, depending, in part, on how to measure or determine the value.

Unless otherwise stated herein, the terms "a/an," "the" and the like used in the description, especially in the appended claims, should be understood to include both singular and plural forms. All the working examples and exemplary terms ("for example" and "such as") are for giving examples of the present invention rather than limiting the scope of the present invention.

In specific embodiments and claims of the present application, a list of items joined by the term "one of" may mean any one of the listed items. For example, if items A and B are listed, then the phrase "one of A and B" means only A or only B. In another example, if items A, B, and C are listed, then the phrase "one of A, B and C" means only A; only B; or only C. The item A may comprise a single component or multiple components. The item B may comprise a single component or multiple components. The item C may comprise a single component or multiple components.

In specific embodiments and claims of the present application, a list of items connected by the term "at least one of" may mean any combination of the listed items. For example, if items A and B are listed, then the phrase "at least one of A and B" means only A; only B; or A and B. In another example, if items A, B and C are listed, then the phrase "at least one of A, B and C" means only A; or only B; only C; A and B (excluding C); A and C (excluding B); B and C (excluding A); or all of A, B and C. The item A may comprise a single component or multiple components. The item B may comprise a single component or multiple components. The item C may comprise a single component or multiple components.

The present invention will be described in detail as follows.

[PN Junction]

The PN junction of the present invention comprises the following semiconductor thin film layers:

(a) a p-type CIGS semiconductor thin film layer; and
(b) an n-type CIGS semiconductor thin film layer.

Figure 2:
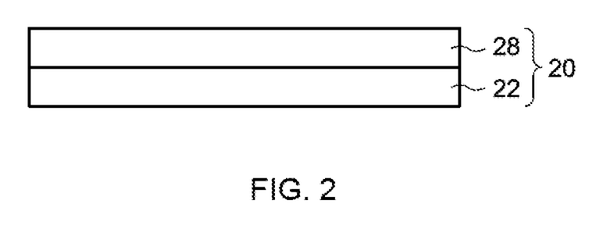
FIG. 2 is a PN junction according to the present invention.

Said PN junction (FIG. 2) replaces the n-type compound semiconductor thin film layer according to the prior art with an n-type CIGS semiconductor thin film layer in order to eliminate the selenization treatment and to decrease the high processing temperature in the process according to the prior art.

P-Type CIGS Semiconductor Thin Film Layer

The p-type CIGS semiconductor thin film layer used in the present invention has a Cu to In molar ratio within the range of 1.55 to 2. For example, the p-type CIGS semiconductor thin film layer may have a Cu to In molar ratio of, but is not limited to, 1.55, 1.60, 1.65, 1.70, 1.75, 1.80, 1.85, 1.90, 1.95 or 2, preferably 1.65 to 1.90, more preferably 1.75 to 1.80. If said molar ratio is more than 2, many $Cu_{In}$ acceptor defects will form in the crystal structure within the film layer, and thereby affect the light absorbing efficiency and the hole carrier transportation. If said molar ratio is less than 1.55, the p-type CIGS semiconductor cannot be produced.

Using p-type CIGS semiconductor with said molar ratio has less defects in the crystal structure and has a higher light absorbing coefficient and a better hole carrier transportation.

According to an embodiment of the present invention, said p-type CIGS semiconductor material has a chemical formula of $Cu(In_xGa_{1-x})Se_2$, where $0.5 \leq x \leq 0.63$, preferably $0.52 \leq x \leq 0.62$. For example, the x in the chemical formula may be, but is not limited to, 0.5, 0.501, 0.503, 0.505, 0.507, 0.509, 0.511, 0.513, 0.515, 0.517, 0.519, 0.521, 0.523, 0.525, 0.527, 0.529, 0.531, 0.533, 0.535, 0.537, 0.539, 0.541, 0.543, 0.545, 0.547, 0.549, 0.551, 0.553, 0.555, 0.557, 0.559, 0.561, 0.563, 0.565, 0.567, 0.569, 0.571, 0.573, 0.575, 0.577, 0.579, 0.581, 0.583, 0.585, 0.587, 0.589, 0.591, 0.593, 0.595, 0.597, 0.599, 0.601, 0.603, 0.605, 0.607, 0.609, 0.611, 0.613, 0.615, 0.617, 0.619, 0.621, 0.623, 0.625 or 0.63.

N-Type CIGS Semiconductor Thin Film Layer

The n-type CIGS semiconductor thin film layer used in the present invention has a Cu to In molar ratio within the range of 1.1 to 1.5. For example, the n-type CIGS semiconductor thin film layer may have a Cu to In molar ratio of, but is not limited to, 1.1, 1.15, 1.2, 1.25, 1.3, 1.35, 1.4, 1.45 or 1.5, preferably 1.1 to 1.35, more preferably 1.2 to 1.25. If said molar ratio is more than 1.5, the N-type CIGS semiconductor thin film layer cannot be produced. If the molar ratio is less than 1.1, many $In_{cu}$ donor defects will form in the crystal structure within the film layer, and thereby affect the electron carrier transportation. Using n-type CIGS semiconductor with said molar ratio requires no selenization treatment.

According to an embodiment of the present invention, said n-type CIGS semiconductor material has a chemical formula of $Cu(In_xGa_{1-x})Se_2$, where $0.63 < x \leq 0.9$, preferably $0.7 \leq x \leq 0.8$. For example, the x in the chemical formula may be, but is not limited to, 0.631, 0.633, 0.635, 0.637, 0.639, 0.641, 0.643, 0.645, 0.647, 0.649, 0.651, 0.653, 0.655, 0.657, 0.659, 0.661, 0.663, 0.665, 0.667, 0.669, 0.671, 0.673, 0.675, 0.677, 0.679, 0.681, 0.683, 0.685, 0.687, 0.689, 0.691, 0.693, 0.695, 0.697, 0.699, 0.701, 0.703, 0.705, 0.707, 0.709, 0.711, 0.713, 0.715, 0.717, 0.719, 0.721, 0.723, 0.725, 0.727, 0.729, 0.731, 0.733, 0.735, 0.737, 0.739, 0.741, 0.743, 0.745, 0.747, 0.749, 0.751, 0.753, 0.755, 0.757, 0.759, 0.761, 0.763, 0.765, 0.767, 0.769, 0.771, 0.773, 0.775, 0.777, 0.779, 0.781, 0.783, 0.785, 0.787, 0.789, 0.791, 0.793, 0.795, 0.797, 0.799, 0.801, 0.803, 0.805, 0.807, 0.809, 0.811, 0.813, 0.815, 0.817, 0.819, 0.821, 0.823, 0.825, 0.827, 0.829, 0.831, 0.833, 0.835, 0.837, 0.839, 0.841, 0.843, 0.845, 0.847, 0.849, 0.851, 0.853, 0.855, 0.857, 0.859, 0.861, 0.863, 0.865, 0.867, 0.869, 0.871, 0.873, 0.875, 0.877, 0.879, 0.881, 0.883, 0.885, 0.887, 0.889, 0.891, 0.893, 0.895, 0.897, 0.899 or 0.9.

The PN junction according to the present invention can be used in a semiconductor thin film element; for example, it can be, but is not limited to, a semiconductor transistor element or photodiode element, in particular a photodiode element.

[Semiconductor Thin Film Photodiode Element]

Figure 3:
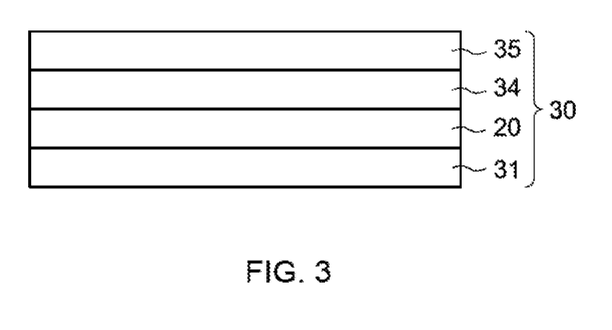
FIG. 3 is a semiconductor thin film photodiode element according to the present invention.

The semiconductor thin film photodiode element according to the present invention comprises the following thin film layers (FIG. 3):
  a. metal electrode thin film layer as anode:
  b. PN junction:
  c. optionally, transparent metal oxide conducting thin film layer as a conducting layer: and
  d. transparent metal oxide thin film layer as cathode.

Said semiconductor thin film photodiode element requires no selenization treatment and uses no CdS n-type compound semiconductor layer in its preparation process, and thus does not involve high temperature reactions. Said semiconductor thin film photodiode element can be prepared at a temperature in the range of about 150° C. to 450° C., and thus the influence on the crystal structure within the thin film can be avoided. Said semiconductor thin film photodiode element has higher photoelectric conversion efficiency.

Metal Electrode Thin Film Layer as Anode

Said metal electrode thin film layer as anode has no special limitations. It can be any metal electrode material known to a person of ordinary skill in the art. For example, it can be, but is not limited to, materials comprising Mo, such as, but without being limited to, Mo, Ti/Mo, Cr/Mo, Al/Mo, Au/Mo or materials containing Ti, Au, Ag, Cu or Cr.

PN Junction

Said PN junction is the PN junction according to the present invention, comprising a p-type CIGS semiconductor thin film layer as a light absorbing layer and an n-type CIGS semiconductor thin film layer as a buffer layer. Said p-type CIGS semiconductor thin film layer as a light absorbing layer has photoelectric conversion characteristics, has a high light absorbing coefficient (larger than 105 $cm^{-1}$), and can absorb light with a wavelength in the range of 350 nm to 1300 nm, preferably in the range of 700 nm to 1100 nm, more preferably in the range of 780 nm to 900 nm. The bandgap of said n-type CIGS semiconductor thin film layer as a buffer layer matches that of the light absorbing layer so that a depletion region with sufficient thickness is formed, and the buffer layer can prevent the light absorbing layer from being destroyed by the subsequent high energy sputter coating process and can protect the inner crystal structure of the light absorbing layer.

Transparent Metal Oxide Conducting Thin Film Layer as a Conducting Layer

Said transparent metal oxide conducting thin film layer as a conducting layer has no special limitations. It can be any metal electrode material known to a person of ordinary skill in the art. For example, it can be, but is not limited to, i-ZnO/ITO, i-ZnO/AZO, i-ZnO/BZO (ZnO:B), i-ZnO/IWO ($In_2O_3$:W), i-ZnO/IWZO ($In_2O_3$:W:ZnO).

Transparent Metal Oxide Thin Film Layer as Cathode

Said transparent metal oxide thin film layer as cathode has no special limitations. It can be any metal electrode material known to a person of ordinary skill in the art. For example, it can be, but is not limited to, i-ZnO/ITO, i-ZnO/AZO, i-ZnO/BZO (ZnO:B), i-ZnO/IWO ($In_2O_3$:W), i-ZnO/IWZO ($In_2O_3$:W:ZnO).

The material of said transparent metal oxide conducting thin film layer as a conducting layer can be the same as or different from that of said transparent metal oxide thin film layer as cathode.

Figure 4:
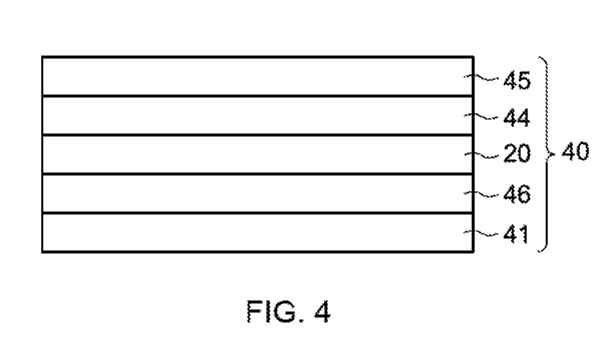
FIG. 4 is an embodiment of the semiconductor thin film photodiode element according to the present invention, additionally comprising a layer containing a molybdenum compound.

According to an embodiment of the present invention, said semiconductor thin film photodiode element further comprises a layer containing a molybdenum compound as a hole transportation thin film layer. Said hole transportation thin film layer is preferably between said metal electrode thin film layer as anode and the p-type CIGS semiconductor thin film layer of said PN junction (FIG. 4), so that the potential difference between the Mo anode thin film layer and the p-type CIGS semiconductor thin film layer is reduced, and thereby the efficiency with which the hole is transported to the anode is increased. Said hole transportation thin film layer is a layer containing a molybdenum compound, and the material thereof can be, for example, but is not limited to, $MoO_2$, $MoSe_2$ or molybdenum compounds doped with a small amount of at least one of elements Li, Na, K, Rb and Cs.

In preparing CIGS photodiode elements, soda-lime glass substrates are frequently used because the alkaline metal ions in the soda-lime glass substrates can diffuse into the CIGS semiconductor thin film layer under high temperature processes, and thereby improve the electric properties of the semiconductor thin film layer. Said hole transportation thin film layer is suitable to be applied to soda-lime glass substrates. On the other hand, when preparing thin film transistor elements, non-soda-lime glass substrates are frequently used in order to avoid the alkaline metal ions in the soda-lime glass substrates diffusing into the oxide layer within the thin film transistor element under high temperature processes, thereby decreasing the electric properties of the thin film transistor elements. It is known that said hole transportation thin film layer can be applied to soda-lime glass substrates, and the photoelectric conversion efficiency will not be altered when said hole transportation thin film layer is applied to the non-soda-lime glass substrates.

Figure 5:
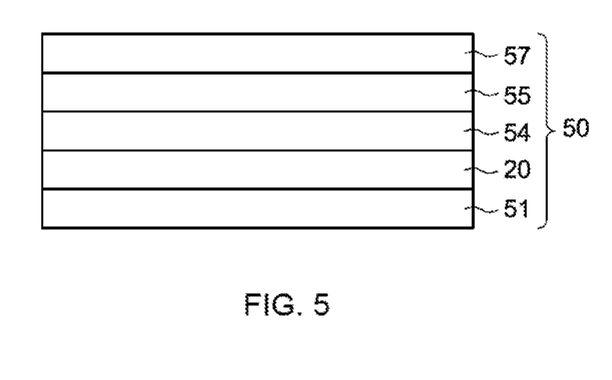
FIG. 5 is an embodiment of the semiconductor thin film photodiode element according to the present invention, additionally comprising a light converting thin film layer.

According to another embodiment of the present invention, said semiconductor thin film photodiode element further comprises a light converting thin film layer (FIG. 5). Said light converting thin film layer is mainly for absorbing incident light of different wavelengths and converting the same to light that can be easily absorbed by the p-type CIGS semiconductor thin film layer as a light absorbing layer, for example, but not being limited to, light of wavelength in the range of 350 nm to 1300 nm, preferably 700 nm to 1100 nm, more preferably 780 nm to 900 nm, and thereby increasing the light absorption of the p-type CIGS thin film layer and promoting the photoelectric conversion of the photodiode element. Said light converting thin film layer may be coated or glued onto the photodiode element and may have a thickness in the range of 0.1 μm to 25 μm, preferably in the range of 1 μm to 10 μm. Said light converting thin film layer also has a function of preventing the cathode/transparent metal oxide conducting thin film layer from being chemically corroded by moisture or acidic or basic liquid, thereby increasing the lifetime of the photodiode element.

Said light converting thin film layer has no special limitations. It can be any light emitting material known to a person of ordinary skill in the art. For example, it can be, but is not limited to, light emitting materials selected from the group consisting of quantum dots, organic phosphorescent or fluorescent materials and rare earths.

Figure 6:
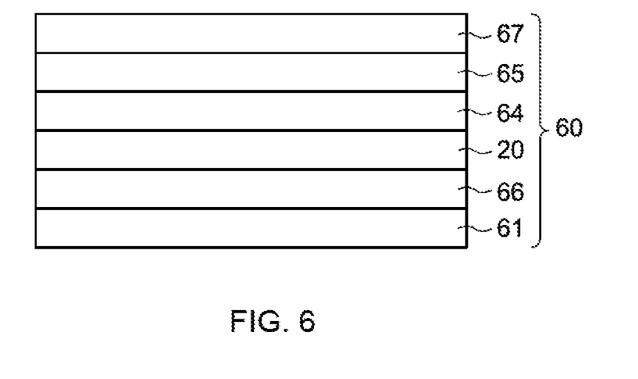
FIG. 6 is an embodiment of the semiconductor thin film photodiode element according to the present invention, additionally comprising both a layer containing a molybdenum compound and a light converting thin film layer.

According to another embodiment of the present invention, said semiconductor thin film photodiode element comprises both a layer containing a molybdenum compound as hole transportation thin film layer and a light converting thin film layer (FIG. 6). Said light converting thin film layer may be coated or glued onto the photodiode element and may have a thickness in the range of 0.1 μm to 25 μm, preferably in the range of 1 μm to 10 μm.

[Photoelectric Sensing Module]

The photoelectric sensing module according to the present invention comprises a semiconductor thin film element comprising a PN junction according to the present invention.

According to an embodiment of the present invention, said semiconductor thin film element is a semiconductor thin film photodiode element, and the photoelectric sensing module further comprises a semiconductor thin film transistor element and a semiconductor light emitting element.

According to an embodiment of the present invention, said semiconductor thin film photodiode element, said semiconductor thin film transistor element and said semiconductor light emitting element are integrated on the same substrate.

According to an embodiment of the present invention, said substrate can be, for example, but is not limited to, glass substrate, stainless steel substrate or flexible substrate, for example, but without being limited to, a plastic thin film substrate.

According to an embodiment of the present invention, the material of the metal electrode thin film layer as anode in said semiconductor thin film photodiode element and the material of source and drain electrodes in said semiconductor thin film transistor element are the same molybdenum compound, so they can be prepared at the same time.

According to an embodiment of the present invention, said semiconductor light emitting element can be, for example, but not being limited to, an X-ray, UV LED, IR LED, IR LD or RGB OLED light source.

The photoelectric sensing module according to the present invention can be used for biometrics, an IR imaging night vision system, an NIR photoelectric switch or an X-ray camera.

[Process for Preparing PN Junction]

The subject application provides a process for preparing said PN junction, comprising the following steps:
(a) stepwise sputter-coating a p-type CIGS semiconductor thin film layer and an n-type CIGS semiconductor thin film layer by using a target material containing elements selected from Cu, In, Ga and Se in a system of multiple continuous vacuum magnetron sputter coating chambers; and
(b) annealing the p-type and n-type CIGS semiconductor thin film layers under inert atmosphere within a temperature range of 350° C. to 450° C., wherein there are two, three or four targets in the coating chambers.

Said target material can be binary, trinary or quaternary targets containing elements selected from Cu, In, Ga and Se, preferably a binary, trinary or quaternary target, for example, but not being limited to, a binary target containing Ga and Se, such as $Ga_xSe_y$, $0<x<2$, $0<y<3$, for example, $Ga_1Se_2$, $Ga_2Se_3$, or $Ga_{1.3}Se_{1.7}$, or containing In and Se, such as $In_xSe_y$, $0<x<2$, $0<y<3$, for example $In_1Se_2$, $In_2Se_3$, or $In_{1.3}Se_{1.7}$, containing Cu and Se, such as $Cu_xSe_y$, $0<x<2$, $0<y<3$, for example, $Cu_1Se_2$, $Cu_2Se_3$, or $Cu_{1.3}Se_{1.7}$, a trinary target containing Cu, Ga and Se, Cu, In and Se, or Cu, In and Ga, or a quaternary target containing Cu, In, Ga and Se, such as, but not being limited to, $Cu_yGaSe_z$, $Cu_y(In_xGa_{1-x})Se_z$, wherein $0.5 \leq x \leq 0.9$, for example, but is not limited to 0.5, 0.501, 0.503, 0.505, 0.507, 0.509, 0.511, 0.513, 0.515, 0.517, 0.519, 0.521, 0.523, 0.525, 0.527, 0.529, 0.531, 0.533, 0.535, 0.537, 0.539, 0.541, 0.543, 0.545, 0.547, 0.549, 0.551, 0.553, 0.555, 0.557, 0.559, 0.561, 0.563, 0.565, 0.567, 0.569, 0.571, 0.573, 0.575, 0.577, 0.579, 0.581, 0.583, 0.585, 0.587, 0.589, 0.591, 0.593, 0.595, 0.597, 0.599, 0.601, 0.603, 0.605, 0.607, 0.609, 0.611, 0.613, 0.615, 0.617, 0.619, 0.621, 0.623, 0.625, 0.63, 0.631, 0.633, 0.635, 0.637, 0.639, 0.641, 0.643, 0.645, 0.647, 0.649, 0.651, 0.653, 0.655, 0.657, 0.659, 0.661, 0.663, 0.665, 0.667, 0.669, 0.671, 0.673, 0.675, 0.677, 0.679, 0.681, 0.683, 0.685, 0.687, 0.689, 0.691, 0.693, 0.695, 0.697, 0.699, 0.701, 0.703, 0.705, 0.707, 0.709, 0.711, 0.713, 0.715, 0.717, 0.719, 0.721, 0.723, 0.725, 0.727, 0.729, 0.731, 0.733, 0.735, 0.737, 0.739, 0.741, 0.743, 0.745, 0.747, 0.749, 0.751, 0.753, 0.755, 0.757, 0.759, 0.761, 0.763, 0.765, 0.767, 0.769, 0.771, 0.773, 0.775, 0.777, 0.779, 0.781, 0.783, 0.785, 0.787, 0.789, 0.791, 0.793, 0.795, 0.797, 0.799, 0.801, 0.803, 0.805, 0.807, 0.809, 0.811, 0.813, 0.815, 0.817, 0.819, 0.821, 0.823, 0.825, 0.827, 0.829, 0.831, 0.833, 0.835, 0.837, 0.839, 0.841, 0.843, 0.845, 0.847, 0.849, 0.851, 0.853, 0.855, 0.857, 0.859, 0.861, 0.863, 0.865, 0.867, 0.869, 0.871, 0.873, 0.875, 0.877, 0.879, 0.881, 0.883, 0.885, 0.887, 0.889, 0.891, 0.893, 0.895, 0.897, 0.899 or 0.9;

wherein 0.8≤y≤1.2, for example, but not being limited to, 0.80, 0.801, 0.803, 0.805, 0.807, 0.809, 0.811, 0.813, 0.815, 0.817, 0.819, 0.821, 0.823, 0.825, 0.827, 0.829, 0.831, 0.833, 0.835, 0.837, 0.839, 0.841, 0.843, 0.845, 0.847, 0.849, 0.851, 0.853, 0.855, 0.857, 0.859, 0.861, 0.863, 0.865, 0.867, 0.869, 0.871, 0.873, 0.875, 0.877, 0.879, 0.881, 0.883, 0.885, 0.887, 0.889, 0.891, 0.893, 0.895, 0.897, 0.899, 0.901, 0.903, 0.905, 0.907, 0.909, 0.911, 0.913, 0.915, 0.917, 0.919, 0.921, 0.923, 0.925, 0.927, 0.929, 0.931, 0.933, 0.935, 0.937, 0.939, 0.941, 0.943, 0.945, 0.947, 0.949, 0.951, 0.953, 0.955, 0.957, 0.959, 0.961, 0.963, 0.965, 0.967, 0.969, 0.971, 0.973, 0.975, 0.977, 0.979, 0.981, 0.983, 0.985, 0.987, 0.989, 0.991, 0.993, 0.995, 0.997, 0.999, 1.001, 1.003, 1.005, 1.007, 1.009, 1.011, 1.013, 1.015, 1.017, 1.019, 1.021, 1.023, 1.025, 1.027, 1.029, 1.031, 1.033, 1.035, 1.037, 1.039, 1.041, 1.043, 1.045, 1.047, 1.049, 1.051, 1.053, 1.055, 1.057, 1.059, 1.061, 1.063, 1.065, 1.067, 1.069, 1.071, 1.073, 1.075, 1.077, 1.079, 1.081, 1.083, 1.085, 1.087, 1.089, 1.091, 1.093, 1.095, 1.097, 1.099, 1.101, 1.103, 1.105, 1.107, 1.109, 1.111, 1.113, 1.115, 1.117, 1.119, 1.121, 1.123, 1.125, 1.127, 1.129, 1.131, 1.133, 1.135, 1.137, 1.139, 1.141, 1.143, 1.145, 1.147, 1.149, 1.151, 1.153, 1.155, 1.157, 1.159, 1.161, 1.163, 1.165, 1.167, 1.169, 1.171, 1.173, 1.175, 1.177, 1.179, 1.181, 1.183, 1.185, 1.187, 1.189, 1.191, 1.193, 1.195, 1.197, 1.199 or 1.2; and wherein 1.8≤z≤2.2, for example, but not being limited to, 1.8, 1.801, 1.803, 1.805, 1.807, 1.809, 1.811, 1.813, 1.815, 1.817, 1.819, 1.821, 1.823, 1.825, 1.827, 1.829, 1.831, 1.833, 1.835, 1.837, 1.839, 1.841, 1.843, 1.845, 1.847, 1.849, 1.851, 1.853, 1.855, 1.857, 1.859, 1.861, 1.863, 1.865, 1.867, 1.869, 1.871, 1.873, 1.875, 1.877, 1.879, 1.881, 1.883, 1.885, 1.887, 1.889, 1.891, 1.893, 1.895, 1.897, 1.899, 1.901, 1.903, 1.905, 1.907, 1.909, 1.911, 1.913, 1.915, 1.917, 1.919, 1.921, 1.923, 1.925, 1.927, 1.929, 1.931, 1.933, 1.935, 1.937, 1.939, 1.941, 1.943, 1.945, 1.947, 1.949, 1.951, 1.953, 1.955, 1.957, 1.959, 1.961, 1.963, 1.965, 1.967, 1.969, 1.971, 1.973, 1.975, 1.977, 1.979, 1.981, 1.983, 1.985, 1.987, 1.989, 1.991, 1.993, 1.995, 1.997, 1.999, 2.001, 2.003, 2.005, 2.007, 2.009, 2.011, 2.013, 2.015, 2.017, 2.019, 2.021, 2.023, 2.025, 2.027, 2.029, 2.031, 2.033, 2.035, 2.037, 2.039, 2.041, 2.043, 2.045, 2.047, 2.049, 2.051, 2.053, 2.055, 2.057, 2.059, 2.061, 2.063, 2.065, 2.067, 2.069, 2.071, 2.073, 2.075, 2.077, 2.079, 2.081, 2.083, 2.085, 2.087, 2.089, 2.091, 2.093, 2.095, 2.097, 2.099, 2.101, 2.103, 2.105, 2.107, 2.109, 2.111, 2.113, 2.115, 2.117, 2.119, 2.121, 2.123, 2.125, 2.127, 2.129, 2.131, 2.133, 2.135, 2.137, 2.139, 2.141, 2.143, 2.145, 2.147, 2.149, 2.151, 2.153, 2.155, 2.157, 2.159, 2.161, 2.163, 2.165, 2.167, 2.169, 2.171, 2.173, 2.175, 2.177, 2.179, 2.181, 2.183, 2.185, 2.187, 2.189, 2.191, 2.193, 2.195, 2.197, 2.199 or 2.2.

The combination of the targets used for the preparation of CIGS may be, for example but without being limited to, a combination of a binary target material and a trinary target material; a combination of a binary target material and a quaternary target material; a combination of two binary target materials; a combination of three binary target materials; or a combination of two trinary target materials, etc. A person of ordinary skill in the art would know how to choose the combination of the targets, i.e., including all four elements Cu, In, Ga and Se in the chosen combination.

Said annealing uses a green light laser or an electric heater as a heating source, wherein said process is a dry process and requires no selenization treatment.

Said inert gas has no special limitations. It can be any inert gas known to a person of ordinary skill in the art. For example, it can be, but is not limited to, nitrogen or argon.

Said annealing can be rapid annealing which is not a selenization treatment and does not involve a substance containing selenium. Said heating source can be, for example, but is not limited to, a green light laser or an electric heater.

According to an embodiment of the present invention, when a green light laser is used as a heating source, the annealing time is in the range of 10 to 120 seconds.

According to an embodiment of the present invention, when an electric heater is used as a heating source, the annealing time is in the range of 180 to 600 seconds.

According to an embodiment of the present invention, the PN junction is prepared on a flexible substrate.

[Process for Preparing Semiconductor Thin Film Photodiode Element]

In one embodiment, said semiconductor thin film photodiode element is prepared by vacuum magnetron sputter coating. When a light converting thin film layer is present, the light converting thin film layer is prepared by jet printing coating, screen printing coating, spin coating, slit nozzle coating, thermal copying coating or transfer printing.

During the preparation of said photodiode element, the thin film layer of the thin film transistor element and the metal wire already prepared on the substrate are not chemically reacted or thermally aged because the temperature is controlled to be within 450° C. and no selenization treatment is required. Said process for preparing photodiode element eliminates preparation steps and the functions of the photodiode element and the thin film transistor element integrated on the same substrate are not altered.

EXAMPLES

Preparing PN Junction
The process for preparing the PN junction comprises the following steps:
1. Providing a substrate in a vacuum coating chamber for coating a p-type CIGS semiconductor thin film layer, wherein the chamber has two targets and the targets use a quaternary target material containing Cu, In, Ga and Se ($Cu(In_{0.63}Ga_{0.27})Se_2$). By co-sputtering, the thin film is deposited with a coating rate of 0.1 to 0.2 µm per minute. The resulted p-type CIGS semiconductor thin film layer has a thickness in the range of 1 to 2 µm and a chemical formula of $Cu(In_{0.63}Ga_{0.27})Se_2$; and
2. the substrate obtained from step 1 is transferred to a vacuum coating chamber for coating an n-type CIGS semiconductor thin film layer, wherein the chamber has two or three targets, wherein the targets are selected from the group consisting of a binary target material containing two elements selected from Cu, In, Ga and Se, for example but without being limited to In and Se, a trinary target material containing three elements selected from Cu, In, Ga and Se, for example but without being limited to Cu, Ga and Se, and a quaternary target material containing Cu, In, Ga and Se, for example but without being limited to $(Cu(In_{0.63}Ga_{0.27})Se_2)$. By co-sputtering, the thin film is deposited with a coating rate of 0.01 to 0.02 µm per minute. The resulted n-type CIGS semiconductor thin film layer has a thickness in the range of 0.05 to 0.1 μm.

The n-type CIGS semiconductor thin film layers of the working examples are prepared by using the following targets:

The n-type CIGS semiconductor thin film layer of working example 1 is prepared by two targets-$CuGaSe_2$ and $In_2Se_3$.

The n-type CIGS semiconductor thin film layer of working example 2 is prepared by three targets-$CuGaSe_2$, $In_2Se_3$ and Cu $(In_{0.63}Ga_{0.27})$ $Se_2$.

Preparing Semiconductor Thin Film Photodiode Element Comprising the PN Junction

The process for preparing a semiconductor thin film photodiode element comprising the PN junction according to the present invention comprises the following steps:

1. providing a glass substrate in a vacuum coating chamber for coating a layer containing molybdenum, heating to 250° C. and then coating the layer containing molybdenum, which is a metal electrode thin film layer as anode, by magnetron sputter coating, where the pressure inside the chamber is in the range of 1.0 to $5.0 \times 10^{-3}$ mbar, and the resulted layer has a thickness of 0.8 μm;
2. transferring the substrate coated with the layer containing molybdenum obtained from step 1 to a vacuum coating chamber for coating sodium molybdate (Mo: Na) and coating a sodium molybdate thin film, which is a hole transportation thin film layer, where sodium is present in an amount of 12 wt % based on the total weight of sodium molybdate target material, and the resulted layer has a thickness of 0.01 to 0.03 μm;
3. preparing a PN junction on the substrate obtained from step 2 by said process above for preparing PN junction;
4. transferring the substrate obtained from step 3 to a vacuum chamber for proceeding with rapid annealing, under inert atmosphere at a temperature in the range within 350° C. to 450° C., wherein the annealing time is in the range of 100 to 300 seconds;
5. transferring the substrate obtained from step 4 to a vacuum coating chamber for coating a transparent metal oxide thin film layer as cathode, wherein the chamber has two targets: first coating an i-ZnO thin film on the rapidly annealed n-type CIGS semiconductor thin film layer at a thickness of 0.01 to 0.02 μm, and then coating an indium tin oxide thin film on the i-ZnO thin film at a thickness of 0.01 to 0.02 μm.

Accordingly, semiconductor thin film photodiode elements are obtained with a layer order: glass substrate/ Mo (0.8 μm)/Mo:Na (0.03 μm)/p-type CIGS (2 μm)/n-type CIGS (0.05 μm)/i-ZnO (0.01 μm)/ITO (0.02 μm). When said photodiode element according to the working examples of the present invention are applied to a solar cell, the short circuit current density (Jsc), the open circuit voltage (Voc), the fill factor (FF) and the conversion efficiency (EFF) are present in Table 1.

Working Examples and Comparative Examples

Table 1 provides a comparison between the photodiode element according to the working examples of the subject application and photodiode elements provided in references.

TABLE 1

| Samples | EFF(η), % | $V_{OC}$, mV | $J_{SC}$, mA/cm² | FF, % |
|---|---|---|---|---|
| Working example-1 | 16.71 | 645 | 34.142 | 75.9 |
| Working example-2 | 16.51 | 652 | 34.175 | 74.1 |
| Comparative example 1 | 18.56 ± 0.60 | 722.7 ± 3.6 | 33.7 6 ± 0.94 | 76.09 ± 0.76 |
| Comparative example 2 | 15.72 | 620 | 34.16 | 74 |
| Comparative example 3 | 18.8 | 678 | 35.22 | 78.65 |
| Comparative example 4 | 17.1 | 617 | 36.3 | 76.3 |

Comparative example 1: Inline $Cu(In,Ga)Se_2$ co-evaporation for high-efficiency solar cells and modules (IEEE Journal of photovoltaics, vol. 3, no. 3, page 1100-1105, July 2013)

Comparative example 2: Surface modification of CIGS film by annealing and its effect on the band structure and photovoltaic properties of CIGS solar cells (Current Applied Physics, 15 (2015) 18-24)

Comparative example 3: Study of thin film solar cells in high temperature condition (Energy Procedia 74 (2015) 1410-1417)

Comparative example 4: Deposition technologies of high-efficiency CIGS solar cells: development of two-step and co-evaporation processes (CRYSTALS 2018, 8, 296)

Comparative example 1: soda-lime glasses/Mo(about 0.35±0.02 μm)/CIGS(1.7±0.3 μm)/CdS(0.05 μm)/i-ZnO (0.09±0.01 μm)/ZnO:Al(0.35±0.02 μm)/$MgF_2$(0.105±0.005 μm)

Comparative example 2: soda-lime glasses/Mo/CIGS(2.0 μm)/CdS(0.05 μm)/i-ZnO(0.05 μm)/ZnO:Al(0.35 μm)

Comparative example 3: soda-lime glasses/Mo/CIGS(3.0 μm)/CdS(0.05 μm)/ZnO(0.2 μm)

Comparative example 4: soda-lime glasses/Mo(about 1.0 μm)/CIGS(about 2.3 μm)/CdS(about 0.05 μm)/i-ZnO(about 0.08 μm)/ZnO:Al(0.35 μm)

Comparative examples 1 to 4 all involve an n-type semiconductor thin film layer containing CdS. It is notable that the photodiode elements according to the present invention are produced by a dry process and require no selenization treatment. The photodiode elements according to the present invention are environmentally friendly given that they are prepared by a Cd free process. Under such circumstance, the efficiency (16.51%) decreases maxima 2.29% in comparison with the prior art (15.72% 至 18.8%), and even increases at least 0.79% in comparison with comparative example 2.

References to "embodiments," "some embodiments," "an embodiment," "another example," "examples," "specific examples" or "some examples" in the specification of the present application mean that at least one embodiment or example of the embodiments of the present application comprises the specific features, structures, materials or characteristics described in the embodiment or example. Therefore, descriptions appearing throughout the specification, such as "in some embodiments," "in the embodiments," "in an embodiment," "in another example," "in an example," "in a particular example" or "examples," are not necessarily referring to the same embodiments or examples in the embodiments of the present application. Furthermore, the particular features, structures, materials or characteristics herein may be combined in any suitable manner in one or more embodiments or examples.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

REFERENCE NUMERALS 10 photodiode element structure
11 anode-metal electrode thin film layer
12 light absorbing layer-p-type CIGS semiconductor thin film layer
13 buffer layer-n-type compound semiconductor thin film layer
14 transparent metal oxide conducting thin film layer
15 cathode-transparent metal oxide thin film layer
20 PN junction
22 p-type CIGS semiconductor thin film layer
28 n-type CIGS semiconductor thin film layer
30 semiconductor thin film photodiode element
31 anode-metal electrode thin film layer
34 transparent metal oxide conducting thin film layer
35 cathode-transparent metal oxide thin film layer
40 semiconductor thin film photodiode element
41 anode-metal electrode thin film layer
44 transparent metal oxide conducting thin film layer
45 cathode-transparent metal oxide thin film layer
46 hole transportation thin film layer-molybdenum compound thin film layer
50 semiconductor thin film photodiode element
51 anode-metal electrode thin film layer
54 transparent metal oxide conducting thin film layer
55 cathode-transparent metal oxide thin film layer
57 light converting thin film layer
60 semiconductor thin film photodiode element
61 anode-metal electrode thin film layer
64 transparent metal oxide conducting thin film layer
65 cathode-transparent metal oxide thin film layer
66 hole transportation thin film layer-molybdenum compound thin film layer
67 light converting thin film layer

What is claimed is:

1. A PN junction, comprising a p-type CIGS semiconductor thin film layer and an n-type CIGS semiconductor thin film layer, wherein the Cu to In molar ratio in the p-type CIGS semiconductor thin film layer is within a range of 1.55 to 2, and wherein the Cu to In molar ratio in the n-type CIGS semiconductor thin film layer is within a range of 1.1 to 1.35,
    wherein the PN junction has at least one of open-circuit voltage ($V_{oc}$) greater than or equal to 645 mV, a short-circuit current density ($J_{SC}$) greater than or equal to 34.142 mA/cm$^2$, a fill factor (FF) greater than or equal to 74.1%, or a conversion efficiency (EFF) greater than or equal to 16.51%.

2. The PN junction according to claim 1, wherein the n-type CIGS semiconductor thin film layer comprises or consists essentially of elements Cu, In, Ga and Se and has a chemical formula of $Cu(In_xGa_{1-x})Se_2$, wherein $0.83 < x \leq 0.9$.

3. A process for preparing the PN junction according to claim 1, comprising following steps:
    (a) stepwise sputter-coating a p-type CIGS semiconductor thin film layer and an n-type CIGS semiconductor thin film layer by using a target material containing elements selected from Cu, In, Ga and Se in a system of multiple continuous vacuum magnetron sputter coating chambers; and
    (b) annealing the p-type and n-type CIGS semiconductor thin film layers under inert atmosphere within a temperature range of 350° C. to 450° C.,
    wherein said annealing uses a green light laser or an electric heater as a heating source, and wherein said process is a dry process and requires no selenization treatment.

4. The process according to claim 3, wherein the PN junction is prepared on a flexible substrate.

5. A semiconductor thin film element, comprising the PN junction according to claim 1.

6. The semiconductor thin film element according to claim 5, wherein the element is a photodiode element that further comprises a metal electrode thin film layer as anode, a transparent metal oxide conducting thin film layer and a transparent metal oxide thin film layer as cathode.

7. The semiconductor thin film element according to claim 6, further comprising a layer containing a molybdenum compound.

8. The semiconductor thin film element according to claim 7, wherein the layer containing the molybdenum compound comprises at least one of following compounds: $MoO_2$ and $MoSe_2$, or the molybdenum compound doped with a small amount of at least one of elements Li, Na, K, Rb and Cs.

9. The semiconductor thin film element according to claim 7, wherein the layer containing the molybdenum compound is arranged between the metal electrode thin film layer as anode and the p-type CIGS semiconductor thin film layer of the PN junction.

10. The semiconductor thin film element according to claim 6, further comprising a light converting thin film layer emitting light having a wavelength within a range of 350 nm to 1300 nm.

11. The semiconductor thin film element according to claim 10, the light converting thin film layer emitting light having the wavelength within the range of 700 nm to 1100 nm.

12. The semiconductor thin film element according to claim 10, wherein the light converting thin film layer comprises a light emitting material selected from a group consisting of quantum dots, organic phosphorescent or fluorescent materials and rare earths.

13. A photoelectric sensing module comprising the semiconductor thin film element according to claim 5.

14. The photoelectric sensing module according to claim 13, wherein the semiconductor thin film element is a photodiode element, and the photoelectric sensing module further comprising a semiconductor thin film transistor element and a semiconductor light emitting element, wherein the semiconductor thin film element, and the semiconductor thin film transistor element, and the semiconductor light emitting element are integrated on the same substrate.

15. The photoelectric sensing module according to claim 14, wherein a material of the metal electrode thin film layer as anode in the photodiode element and a material of a source electrode and a drain electrode in the semiconductor thin film transistor element are the same molybdenum compound.

16. The photoelectric sensing module according to claim 14, wherein the semiconductor light emitting element is an X-ray, UV LED, IR LED, IR LD or RGB OLED light source.

17. Use of the photoelectric sensing module according to claim 13, for biometrics, an IR imaging night vision system, an NIR photoelectric switch or an X-ray camera.

18. The PN junction of claim 1, wherein the PN junction has at least one of open-circuit voltage ($V_{oc}$) ranging from 645 mV to 652 mV, a short-circuit current density ($J_{SC}$) ranging from 34.142 mA/cm$^2$ to 34.175 mA/cm$^2$, a fill factor (FF) ranging from 74.1% to 75.9% or a conversion efficiency (EFF) ranging from 16.51% to 16.71%.

19. The PN junction of claim 1, wherein the Cu to In molar ratio in the n-type CIGS semiconductor thin film layer is within a range of 1.1 to 1.2.

* * * * *